(12) United States Patent
Kim et al.

(10) Patent No.: US 11,724,268 B2
(45) Date of Patent: Aug. 15, 2023

(54) NOZZLE FOR CLEANING SUBSTRATE AND METHOD OF MANUFACTURING THE SAME

(71) Applicant: HS HI-TECH CO., LTD., Hwaseong (KR)

(72) Inventors: Beom Jin Kim, Hwaseong (KR); Hyun Sin Kim, Cheonan (KR)

(73) Assignee: HS HI-TECH CO., LTD., Gyeonggi-do (KR)

( * ) Notice: Subject to any disclaimer, the term of this patent is extended or adjusted under 35 U.S.C. 154(b) by 0 days.

(21) Appl. No.: 16/614,311

(22) PCT Filed: Jun. 20, 2019

(86) PCT No.: PCT/KR2019/007431
§ 371 (c)(1),
(2) Date: Jan. 2, 2020

(87) PCT Pub. No.: WO2020/004866
PCT Pub. Date: Jan. 2, 2020

(65) Prior Publication Data
US 2021/0331184 A1    Oct. 28, 2021

(30) Foreign Application Priority Data

Jun. 25, 2018 (KR) .................. 10-2018-0072752

(51) Int. Cl.
*B05B 1/18* (2006.01)
*B08B 3/02* (2006.01)
(Continued)

(52) U.S. Cl.
CPC ............... *B05B 1/185* (2013.01); *B08B 3/02* (2013.01); *H01L 21/67051* (2013.01); *B29C 65/08* (2013.01)

(58) Field of Classification Search
CPC ..... B05B 1/185; B08B 3/02; H01L 21/67051; H01L 21/02; H01L 21/02052;
(Continued)

(56) References Cited

U.S. PATENT DOCUMENTS 6,488,040 B1 * 12/2002 de Larios .................. B08B 3/04
134/167 R
6,659,116 B1 * 12/2003 Williams ................ B24B 37/04
134/179

(Continued)

FOREIGN PATENT DOCUMENTS

| CN | 101011882 A | 8/2007 |
| CN | 103155104 A | 6/2013 |

(Continued)

OTHER PUBLICATIONS

Translation of KR 1020160008720. (Year: 2022).*
(Continued)

*Primary Examiner* — Alexander Markoff

(57) ABSTRACT

The present invention relates to a nozzle for cleaning a substrate by discharging cleaning liquid to the substrate and a method of manufacturing the nozzle and, more particularly, to a nozzle for cleaning a substrate and a method of manufacturing the nozzle, the nozzle having pressure resistance performance capable of enduring high supply pressure of the cleaning liquid.

8 Claims, 10 Drawing Sheets

(51) Int. Cl.
*H01L 21/67* (2006.01)
*B29C 65/08* (2006.01)

(58) Field of Classification Search
CPC ... H01L 21/6715; B29C 65/08; B29C 66/112;
B29C 66/114; B29C 66/124; B29C
66/5346; B29C 66/71; B29C 66/73921;
B29K 2071/00
See application file for complete search history.

(56) References Cited

U.S. PATENT DOCUMENTS

| | | | | |
|---|---|---|---|---|
| 6,988,327 B2 * | 1/2006 | Garcia | ............. | H01L 21/67034 |
| | | | | 216/84 |
| 7,003,899 B1 * | 2/2006 | Garcia | ............. | H01L 21/67034 |
| | | | | 34/570 |
| 7,069,937 B2 * | 7/2006 | Garcia | ............. | H01L 21/67034 |
| | | | | 134/103.3 |
| 7,143,527 B2 * | 12/2006 | Garcia | ............. | H01L 21/67034 |
| | | | | 134/902 |
| 7,293,571 B2 * | 11/2007 | Woods | ............. | H01L 21/67028 |
| | | | | 134/102.3 |
| 7,363,727 B2 * | 4/2008 | O'Donnell | ........ | H01L 21/67075 |
| | | | | 134/902 |
| 7,389,783 B2 * | 6/2008 | Woods | ................ | H01L 21/6708 |
| | | | | 134/198 |
| 7,811,423 B2 * | 10/2010 | Woods | ............. | H01L 21/67005 |
| | | | | 204/224 R |
| 2005/0217703 A1 | 10/2005 | O'Donnell | | |
| 2006/0005860 A1 * | 1/2006 | Garcia | ............. | H01L 21/67028 |
| | | | | 134/95.1 |
| 2009/0114249 A1 * | 5/2009 | Mikhaylichenko | ... | H01L 21/288 |
| | | | | 205/205 |
| 2009/0159201 A1 * | 6/2009 | Kholodenko | ..... | H01L 21/02057 |
| | | | | 156/292 |
| 2009/0280235 A1 | 11/2009 | Lauerhaas et al. | | |
| 2010/0037922 A1 * | 2/2010 | Kholodenko | ..... | H01L 21/67051 |
| | | | | 134/95.1 |
| 2010/0043822 A1 * | 2/2010 | Magni | ................ | H01L 21/6708 |
| | | | | 118/300 |
| 2010/0071730 A1 * | 3/2010 | Ravkin | ............ | H01L 21/67028 |
| | | | | 134/95.1 |
| 2010/0126528 A1 * | 5/2010 | Kholodenko | ....... | C11D 11/0047 |
| | | | | 134/21 |
| 2011/0100399 A1 * | 5/2011 | Kholodenko | ..... | H01L 21/67057 |
| | | | | 348/125 |
| 2016/0346795 A1 | 12/2016 | Choi et al. | | |
| 2019/0164788 A1 * | 5/2019 | Han | ................. | B29C 66/30325 |

FOREIGN PATENT DOCUMENTS

| | | | |
|---|---|---|---|
| CN | 103596700 | A | 2/2014 |
| CN | 106057622 | A | 10/2016 |
| CN | 107546152 | A | 1/2018 |
| JP | 2006224619 | A | 8/2006 |
| JP | 2014-12239 | A | 1/2014 |
| KR | 20110071840 | A | 6/2011 |
| KR | 101842128 | B1 * | 1/2016 |
| KR | 20160005825 | A | 1/2016 |
| KR | 20160008720 | A | 1/2016 |
| KR | 10-2017-0034135 | A | 3/2017 |
| KR | 20170118995 | A | 10/2017 |
| KR | 101842128 | B1 | 3/2018 |

OTHER PUBLICATIONS

The Office Action for Taiwanese Patent Application No. 108121878, dated Dec. 19, 2022.
The Search Report of Taiwanese Patent Application No. 108121878, dated Dec. 16, 2022.
The First Office Action Notification for Chinese Patent Application No. 201980041845.6, dated May 31, 2023.

* cited by examiner

NOZZLE FOR CLEANING SUBSTRATE AND METHOD OF MANUFACTURING THE SAME

CROSS-REFERENCE TO RELATED APPLICATIONS

The present application is a U.S. Regional Stage of International Patent Application No. PCT/KR2019/007431 filed on Jun. 20, 2019.

TECHNICAL FIELD

The present invention relates to a nozzle for cleaning a substrate by discharging cleaning liquid to the substrate and a method of manufacturing the nozzle.

BACKGROUND ART

Various processes such a photolithography, etching, and thin film deposition are performed on a substrate that is used for manufacturing a semiconductor chip, a light emitting diode (LED) chip, and the like.

Foreign matter such as particles is generated when the various processes are performed on the substrate. In order to remove the foreign matter, a cleaning process is performed to clean the substrate before or after each of the processes is performed.

In the cleaning process, chemical is sprayed, treatment liquid mixed with gas is sprayed, or cleaning liquid is sprayed for removing the foreign matter. In the methods, the method of spraying the cleaning liquid is performed by supplying the cleaning liquid to a nozzle for cleaning a substrate and discharging the cleaning liquid.

A nozzle of the above-described method of spraying the cleaning liquid for cleaning a substrate discloses in Korean Patent No. 10-1842128 (Hereinbelow, referred to as 'patent document 1').

The nozzle of patent document 1 includes: a flow path in which cleaning liquid flows; a body having a discharging hole communicating with the flow path to discharge treatment liquid, a piezoelectric element configured to pressurize the treatment liquid flowing through the body to discharge the treatment liquid as droplets through the discharging hole. Wherein the treatment liquid is introduced through a main flow path formed vertically, passes through the flow path formed horizontally, and is discharged through the discharging hole.

It is important that the nozzle can withstand the pressure (Hereinbelow, referred to 'flow pressure') of the treatment liquid (or cleaning liquid) flowing in the nozzle, that is, the pressure resistance. When the flow pressure is higher than the pressure inside the nozzle, due to the high flow pressure, the flow path in the nozzle is damaged, or leakage occurs at the coupling portion of the nozzle.

As the cause of increase in the flow pressure, the flow pressure may be maintained high when the pressure (Hereinbelow, referred to 'supply pressure') of the supplied treatment liquid (or cleaning liquid) is high, and the flow pressure is increased abnormally sharply when the discharging hole is blocked by foreign matter such as particles.

The supply pressure relates to the pressure (Hereinbelow, referred to 'discharging pressure') of the treatment liquid discharged through the discharging hole of the nozzle. In this case, when the supply pressure is high, the flow pressure is maintained high, thereby maintaining the discharging pressure high. The supply pressure is determined on the basis of the pressure resistance performance of the nozzle, and a nozzle having a high pressure resistance performance may provide high discharging pressure performance through high supply pressure. That is, the high pressure resistance performance of the nozzle is the cause of increasing the discharging performance of the nozzle.

Meanwhile, when the discharging hole is blocked by foreign matter and the flow pressure is increased abnormally sharply, and the nozzle have low pressure resistance performance, the flow path is damaged by the treatment liquid. specifically, as shown in FIG. 5 of patent document 1, when a curved third flow path connects a first flow path and a second flow path together to form an overall continuous S shape, the pressure is not canceled at the third flow path that is a connection portion between the first and second flow paths, thus the third flow path does not endure the high flow pressure and is damaged.

As described above, the high pressure resistance performance of the nozzle is important in an aspect of the discharging performance of the nozzle and of the strength of the nozzle. Therefore, there is a need to develop a nozzle for cleaning a substrate with the high pressure resistance performance.

DOCUMENTS OF RELATED ART

Patent Document (Patent Document 1) Korean Patent No. 10-1842128

DISCLOSURE

Technical Problem

Accordingly, the present invention has been made keeping in mind the above problems occurring in the prior art, and an object of the present invention is to provide a nozzle for cleaning a substrate with high pressure resistance performance and a method of manufacturing the nozzle to improve the discharging performance of the nozzle for cleaning a substrate, and to prevent damage to flow paths inside the nozzle for cleaning a substrate.

Technical Solution

In order to accomplish the above object, the present invention provides a nozzle for cleaning a substrate. The nozzle includes: an upper flow path part communicating with a main hole; and a lower flow path part connecting the upper flow path part to a discharging hole so as to allow the upper flow path part and the discharging hole to communicate with each other. Wherein an upper surface of the upper flow path part and a lower surface of the lower flow path part may be vertically spaced apart from each other.

Further, the nozzle may include: a first body; and a second body coupled to a lower portion of the first body such that an upper surface of the second body is in contact with a lower surface of the first body. Wherein the upper flow path part having an open lower portion may be formed on the lower surface of the first body, and the lower flow path part having an open upper portion may be formed on the upper surface of the second body, and an upper portion of the discharging hole may communicate with the lower surface of the lower flow path part, and an open lower portion of the discharging hole may be formed on a lower surface of the second body.

The upper flow path part may have a branched section in which an open lower portion at an end of the branched section may communicate with the open upper portion of the lower flow path part, and the end of the branched section may be blocked by the first body.

The lower flow path part may be provided as a plurality of lower flow paths formed separately and spaced apart from each other.

Each of the plurality of lower flow paths may communicate with a plurality of discharging holes.

The plurality of discharging holes communicating with each of the plurality of lower flow paths may be arranged in one row in a longitudinal direction of each of the plurality of lower flow paths.

The upper flow path part may include a first upper flow path part communicating with a first side of the lower flow path part and a second upper flow path part communicating with a second side of the lower flow path part, the first upper flow path part and the second upper flow path part being configured to be in non-communication with each other on a same plane.

The upper flow path part may include: a main flow path communicating perpendicularly with a vertical flow path communicating with the main hole; and a branched section communicating with the main flow path and configured such that a lower portion of an end thereof communicates with an upper portion of the lower flow path part.

The lower flow path part may be provided as a plurality of lower flow paths, and flow distances of cleaning liquid flowing to the plurality of lower flow paths through the vertical flow path, the main flow path, and the branched section may be the same.

A method of manufacturing a nozzle for cleaning a substrate, the method include: providing a body, wherein a first body is provided such that a first upper flow path part and a second upper flow path part are formed on a lower surface of the first body and a first main hole communicating with the first upper flow path part and a second main hole communicating with the second upper flow path part are formed on an upper surface thereof, and a second body is provided such that a plurality of lower flow paths is formed separately on an upper surface thereof to be spaced apart from each other; and coupling the lower surface of the first body and the upper surface of the second body together, wherein the coupling is provided to connect an upper portion of a first side of each of the plurality of lower flow paths to a lower portion of an end of a first branched section of the first upper flow path part so as to allow the first side of each of the lower flow paths and the end of the first branched section communicate with each other, and to connect an upper portion of a second side of each of the plurality of lower flow paths to a lower portion of an end of a second branched section of the second upper flow path part so as to allow the second side of each of the lower flow paths and the end of the second branched section to communicate with each other.

In the providing the body, the first and second upper flow path parts and the plurality of lower flow paths may be respectively formed by machining, and in the coupling the first and second bodies together, unmachined portions of the first and second bodies and machined portions thereof may face each other to form a sealed flow path structure.

In the providing the body, a welding protrusion may be formed on any one of the lower surface of the first body and the upper surface of the second body and a welding groove into which the welding protrusion may be inserted may be formed on a remaining one of the lower surface of the first body and the upper surface of the second body, and at least a part of the welding protrusion and at least a part of the welding groove may be formed outside the first and second upper flow path parts and the plurality of lower flow paths so as to surround the first and second upper flow path parts and the plurality of lower flow paths.

In the providing the body, the first and second bodies may be made of Polyetheretherketone (PEEK), and in the coupling the first and second bodies together, the coupling of the lower surface of the first body and the upper surface of the second body may be performed by welding the welding protrusion and the welding groove together by using ultrasonic welding.

Advantageous Effects

As described above, the nozzle for cleaning a substrate of the present invention has the following effects.

The first and second planes, in which the upper flow path part and the lower flow path part are formed respectively, are spaced apart from each other in the vertical direction. Through this structure, a vertical head is formed at the communication section between the upper and lower flow path parts, thus the nozzle for cleaning a substrate can have the high pressure resistance.

Accordingly, it is possible to discharge the cleaning liquid without the dead zone by ensuring the uniformity of the cleaning liquid discharged through the discharging hole.

The cleaning liquid supplied into the nozzle for cleaning a substrate hits the unmachined surface to flow, so that the present invention has high pressure resistance performance compared to the conventional nozzle for cleaning a substrate. Accordingly, it is possible to discharge the cleaning liquid without the dead zone by ensuring the uniformity of the cleaning liquid discharged through the discharging hole.

The end of the branched section of the upper flow path part is blocked by the first body. Accordingly, the flow of the cleaning liquid from the upper flow path part to the lower flow path part is smoothly performed.

The plurality of lower flow paths of the lower flow path part is formed separately to be spaced apart from each other. Accordingly, forces applied to the lower flow paths that face each other are canceled, thereby contributing the high pressure resistance performance of the nozzle for cleaning a substrate.

The flow distances of cleaning liquid flowing to the plurality of lower flow paths through the vertical flow path, the main flow path, and the branched section are the same. Accordingly, the same amount of the cleaning liquid can be supplied each of the plurality of lower flow paths, thereby ensuring the uniformity of the cleaning liquid.

The first and second upper flow path parts are in non-communication with each other on the same X-Y plane, that is, on the first plane, so that the cleaning liquids supplied to the first and second main holes do not affect each other in the first and second upper flow path parts. Accordingly, the flow pressures of the cleaning liquids in the first and second upper flow path parts can be uniformly maintained.

Due to the high pressure resistance performance of the nozzle for cleaning a substrate, it is possible to prevent damage to flow paths inside the nozzle for cleaning a substrate and to prevent damage to the coupling portion.

According to the method of manufacturing the nozzle for cleaning a substrate, it is possible to easily form the flow path structure and to reduce the flow path machining cost, thereby contributing the high pressure resistance performance of the nozzle for cleaning a substrate.

According to the method of manufacturing the nozzle for cleaning a substrate, ultrasonic welding is used in the coupling. Accordingly, the separate adhesive is not required for the coupling the first and second bodies together, and the coupling state can be solidly maintained by the strong molecular coupling. Furthermore, the damage to the flow paths can be prevented due to the excellent coupling between the first and second bodies, thereby contributing to maintaining the high pressure resistance performance of the nozzle for cleaning a substrate.

MODE FOR INVENTION

Figure 1:
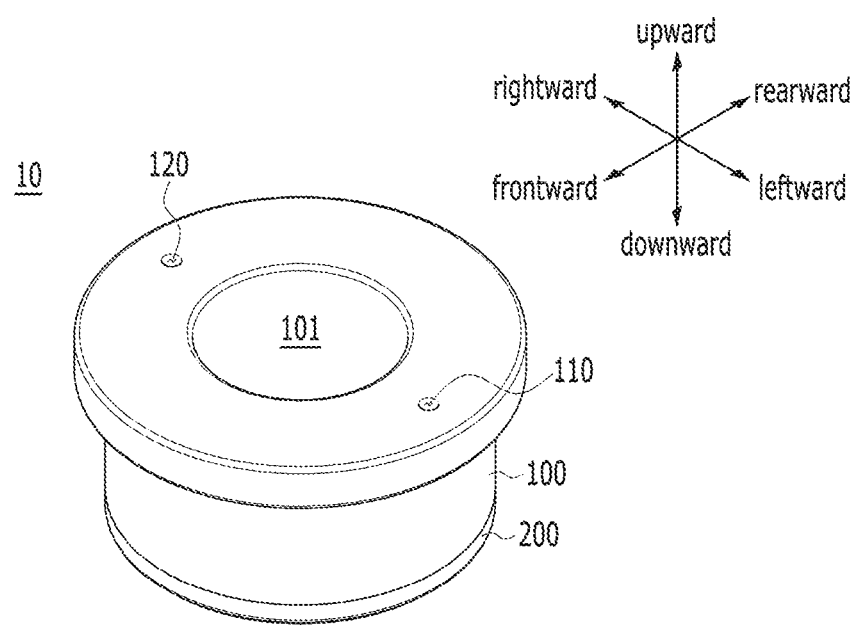
FIG. 1 is a perspective view showing a nozzle for cleaning a substrate according to an exemplary embodiment of the present invention.

Hereinbelow, the following illustrates the principle of the present invention. Those skilled in the art will be able to embody the principle of the present invention and invent various apparatuses included in the spirit and the scope of the invention, although not shown herein. Further, all conditional terms and embodiments described herein are clearly intended for the purpose of understanding the concept of the invention, and should be understood not to be limited to the specifically listed embodiments and states.

The above and other objectives, features and advantages of the present invention will be more clearly understood from the following detailed description taken in conjunction with the accompanying drawings. Accordingly, the technical spirit of the present invention may be easily embodied by those skilled in the art to which this invention belongs will.

The embodiments described herein will be described with reference to sectional views and/or perspective views, which are ideal drawings of the present invention. Therefore, the embodiments of the present invention are not limited to the specific forms shown in the drawings, but include the changes in the forms caused by manufacturing processes.

Prior to the description, the following details will be defined.

In the accompanying drawings, an upward to downward direction means the Z axis direction, a leftward to rightward direction means the X axis direction, and a forward to rearward direction means the Y axis direction.

Hereinbelow, a nozzle 10 for cleaning a substrate according to an exemplary embodiment of the present invention will be described with reference to FIGS. 1 to 7.

Figure 2:
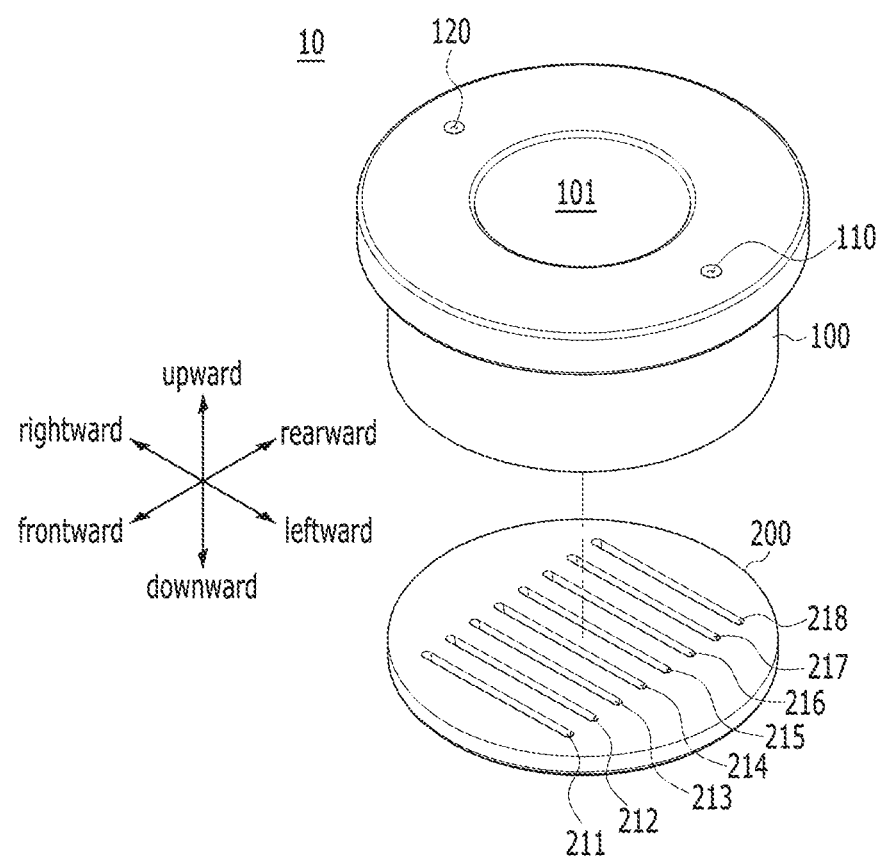
FIG. 2 is an exploded-perspective view showing the nozzle for cleaning a substrate of FIG. 1.
Figure 3:
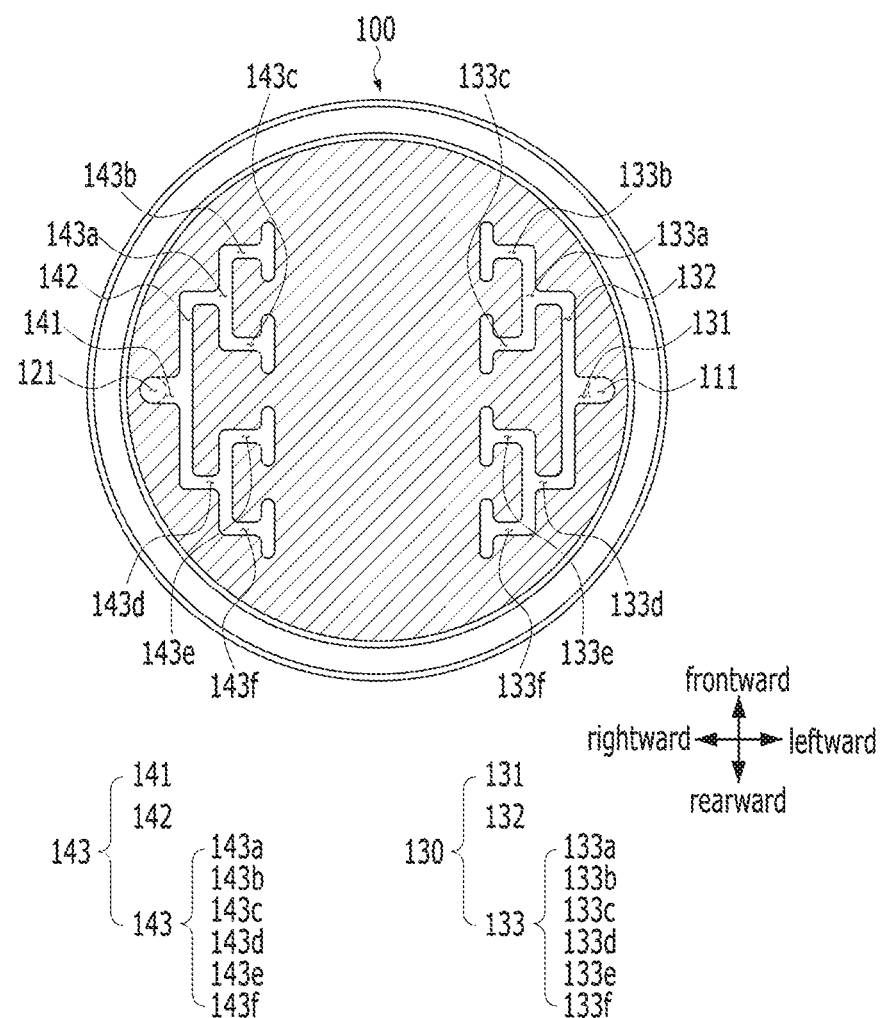
FIG. 3 is a bottom view showing a lower surface of a first body of FIG. 2.
Figure 4:
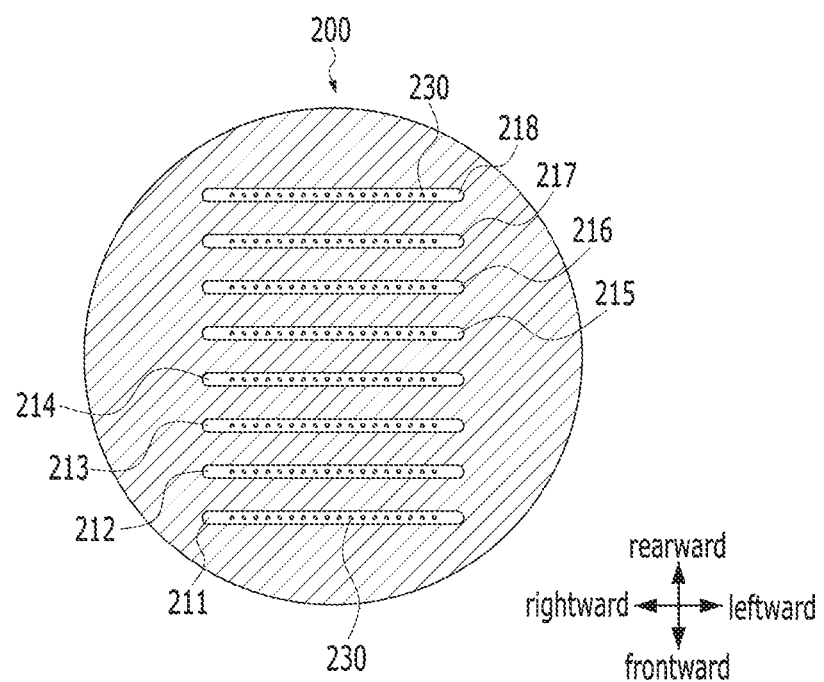
FIG. 4 is a plane view showing an upper surface of a second body of FIG. 2.
Figure 5:
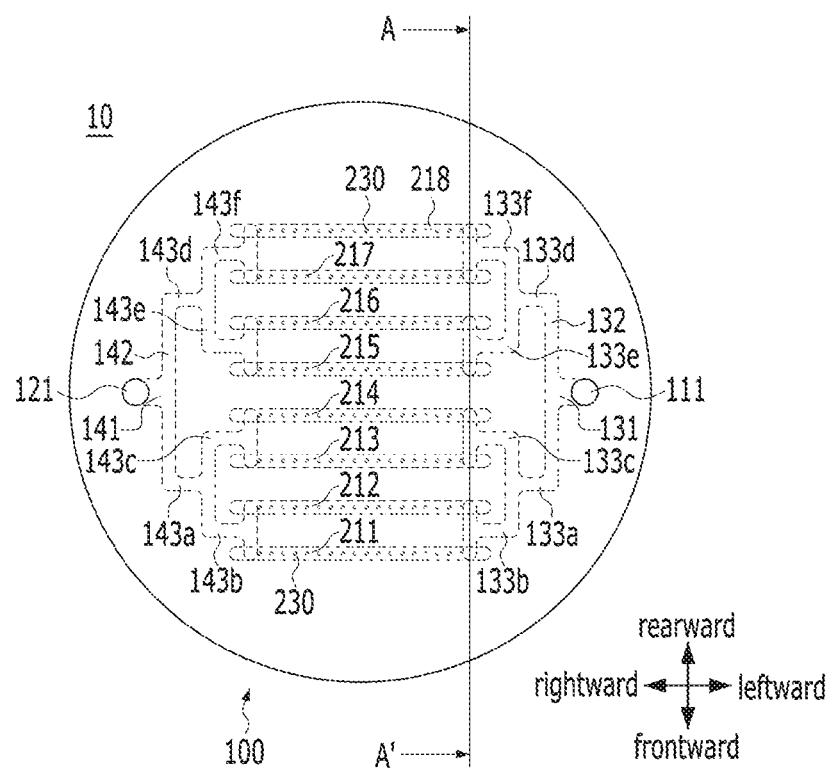
FIG. 5 is a perspective plane view showing a flow path structure inside the first and second bodies of FIG. 1.
Figure 6:
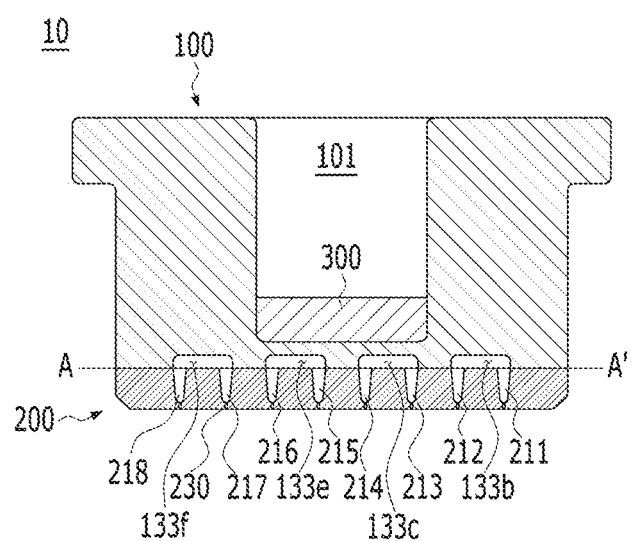
FIG. 6 is a sectional view taken along A-A' line of FIG. 5.
Figure 7:
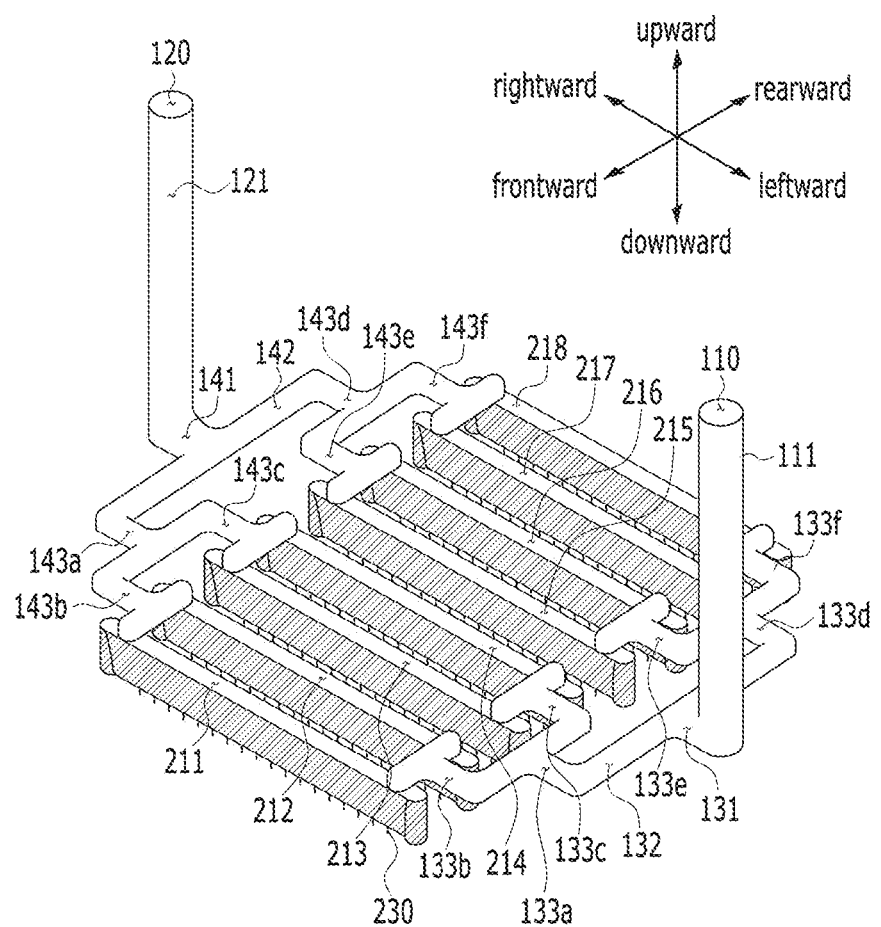
FIG. 7 is a perspective view showing only the flow path structure inside the first and second bodies of FIG. 5.

FIG. 1 is a perspective view showing the nozzle for cleaning a substrate according to the exemplary embodiment of the present invention; FIG. 2 is an exploded-perspective view showing the nozzle for cleaning a substrate of FIG. 1; FIG. 3 is a bottom view showing a lower surface of a first body of FIG. 2; FIG. 4 is a plane view showing an upper surface of a second body of FIG. 2; FIG. 5 is a perspective plane view showing a flow path structure inside the first and second bodies of FIG. 1; FIG. 6 is a sectional view taken along A-A' line of FIG. 5; and FIG. 7 is a perspective view showing only the flow path structure inside the first and second bodies of FIG. 5.

As shown in FIGS. 1 and 2, according to the exemplary embodiment of the present invention, the nozzle 10 for cleaning a substrate includes: an upper flow path part communicating with a main hole; a lower flow path part connecting the upper flow path part to a discharging hole 230 so as to allow the upper flow path part and the discharging hole 230 to communicate with each other; a first body 100 provided with the upper flow path part on a lower surface thereof; and a second body 200 provided with the lower flow path part on an upper surface thereof and with the discharging hole 230 on a lower surface thereof. At this point, an upper surface of the upper flow path part and a lower surface of the lower flow path part are spaced apart from each other in a vertical direction, that is, in the Z axis direction.

The First Body 100

Hereinbelow, the first body 100 will be described with reference to FIGS. 1 to 5.

As shown in FIGS. 1 to 3, and FIG. 6, a center hole 101 into which a piezoelectric element 300 is inserted is provided at the center of the first body 100, the main hole through which cleaning liquid is supplied is provide on an upper surface of the first body 100, and the upper flow path part is provided at the lower surface of the first body 100.

The piezoelectric element 300 is inserted into the center hole 101. The piezoelectric element 300 functions to help discharging of the cleaning liquid that is discharged through the discharging hole 230 by being vibrated when electricity is applied thereto through an electrode and the like. Accordingly, in order to maximize effect of the vibration, the piezoelectric element 300 is preferably inserted into the center hole 101 to be in contact with the first body 100.

The main hole functions the cleaning liquid to flow into the nozzle 10 for cleaning a substrate through a vertical flow path and the upper flow path part that communicate with the main hole.

The main hole may include: a first main hole 110 communicating with a first vertical flow path 111 and a first upper flow path part 130; and a second main hole 120 communicating with a second vertical flow path 121 and a second upper flow path part 140. The first main hole 110 is provided on a left side of the upper surface of the first body 100, and the second main hole 120 is provided on a right side of the upper surface of the second body 200. Accordingly, the center hole 101 is arranged between the first and second main holes 110 and 120.

The first vertical flow path 111 is provided inside the first body 100 in a vertical direction, that is, the Z axis direction.

An upper end of the first vertical flow path 111 communicates with the first main hole 110. A lower end of the first vertical flow path 111 communicates with a first main branched flow path 132 of the first upper flow path part 130.

The second vertical flow path 121 is provided inside the first body 100 in the vertical direction, that is, the Z axis direction.

An upper end of the second vertical flow path 121 communicates with the second main hole 120, and a lower end of the second vertical flow path 121 communicates with a second main branched flow path 142 the second upper flow path part 140.

The first main hole and the first vertical flow path 110 and 111 and the second main hole and the second vertical flow path 120 and 121 are arranged to be symmetrical with respect to a centerline of the first body 100.

The upper flow path part is formed on the lower surface of the first body 100 with having an open lower portion thereof, and the upper flow path part functioning to flow the cleaning liquid flowing through the main hole and the vertical flow path into the lower flow path part. As described above, since the upper flow path part having the open lower portion is formed on the lower surface of the first body 100, when the first and second bodies 100 and 200 are coupled together, a lower surface of the upper flow path part is the upper surface of the second body 200.

The upper flow path part may include: a main flow path perpendicularly communicating with the vertical flow path that communicates with the main hole; and a branched section communicating with the main flow path and configured such that a lower end thereof communicates with an upper portion of the lower flow path part.

At this point, the lower flow path part may be provided as a plurality of lower flow paths. Flowing distances of the cleaning liquid into the plurality of lower flow paths through the vertical flow path, the main flow path, and the branched section are the same.

An end of the branched section is blocked by the first body. Thus, the cleaning liquid flowing into the branched section flows into the lower flow path part through the lower end of the branched section and the upper portion of the lower flow path part.

The upper flow path part may include: the first upper flow path part 130 communicating with a first side of the lower flow path part; and the second upper flow path part 140 communicating with a second side of the lower flow path part. At this point, the first side of the lower flow path part may be a left side in FIG. 7, and the second side thereof may be a right side therein.

The main flow path and the branched section also include first and second main flow paths 131 and 141, and first and second branched sections 133 and 143, respectively. At this point, the first and second upper flow path parts 130 and 140 are arranged to be symmetrical with respect to the centerline of the first body 100. Detailed descriptions of the first and second upper flow path parts 130 and 140 will be described herein. Furthermore, the first and second branched sections 133 and 143 each have a shape in which a plurality of branched flow paths with '⊥' shapes continuously communicates with each other, and the detailed description thereof will be described herein.

The upper flow path part described above, that is, the first and second upper flow path parts 130 and 140 are provided by machining the lower surface of the first body 100. The machining of the first and second upper flow path parts 130 and 140 may be performed by machining and the like. The upper flow path part, that is, the machining of the first and second upper flow path parts 130 and 140 are performed to open lower portions thereof.

The Second Body 200

Hereinbelow, the second body 200 will be described with reference to FIGS. 1 to 6.

The second body 200 is coupled to a lower portion of the first body 100 such that the lower surface of the first body 100 and the upper surface of the second body 200. The lower flow path part is provided on the upper surface of the second body 200, and a plurality of discharging holes 230 is provided on the lower surface of the second body 200.

When the second body 200 is coupled to the lower portion of the first body 100, the lower surface the first body 100 and the upper surface of the second body 200 are in contact with each other. Therefore, a diameter of the second body 200 is preferably equal to a diameter of the lower surface of the first body 100.

The lower flow path part is provided on the upper surface of the second body 200 with having the open upper portion.

The plurality of discharging holes 230 is provided on the lower surface of the second body 200 such that upper portions of the discharging holes 230 communicate with the lower surface of the lower flow path part and lower portions of the discharging holes 230 are open.

As described above, as the lower flow path part having the open upper portion is provided on the upper surface of the second body 200, when the first and second bodies 100 and 200 are coupled together, an upper surface of the lower flow path part becomes the lower surface of the first body 100.

The lower flow path part may include a plurality of lower flow paths. In the present invention, the lower flow path part is provided as 8 lower flow paths, that is, first to eighth lower flow paths 212 to 218.

The plurality of lower flow paths, that is, the first to eighth lower flow paths 212 to 218 are provided on the upper surface of the second body 200 by being formed separately and spaced apart from each other.

The first to eighth lower flow paths 212 to 218 have the same separation distance from each other. Each of the first to eighth lower flow paths 212 to 218 is formed in a long shape in a direction from the left side to the right side, that is, in the X axis direction. The first to eighth lower flow paths 212 to 218 may be arranged to be parallel with each other in the Y axis direction such that first ends and second ends thereof are collinear.

Each of the plurality of lower flow paths, that is, each of the first to eighth lower flow paths 212 to 218 communicates with the plurality of discharging holes 230, thus the discharging holed 230 are disposed on a lower surface (or bottom surface) of each of the first to eighth lower flow paths 212 to 218. At this point, the plurality of lower flow paths, that is, the plurality of discharging holes 230 communicating with each of the first to eighth lower flow paths 212 to 218 may be disposed as one row in a longitudinal direction of each of the first to eighth lower flow paths 212 to 218, that is, a leftward to rightward direction or the X axis direction.

The plurality of lower flow paths, that is, the first to eighth lower flow paths 212 to 218 are provided by machining the upper surface of the second body 200. The first to eighth lower flow paths 212 to 218 may be formed by machining.

The plurality of discharging holes 230 may be formed by using a laser on the bottom surface of the machined first to eighth lower flow paths 212 to 218. At this point, a diameter of the discharging hole 230 may be 5 μm~15 μm.

The first body 100 and the second body 200 that are described above may be made of quartz, sapphire of an aluminum oxide material, or engineering plastics.

The engineering plastics have tensile strength of 500 kgf/cm$^2$ or more, flexural modulus of 20,000 kgf/cm$^2$ or more, and heat resistance of 100° C. or more, and may be divided into a thermoplastic engineering plastics that may be molded by being heated and a thermosetting engineering plastics that may harden by being heated. Examples of the thermoplastic engineering plastics may include polyamide, polyacetal (POM), polybutylene terephthalate (PBT), polyethylene terephthalate (PET), syndiotactic polystyrene (SPS), polyether sulfone (PES), polyetheretherketone (PEEK), and the like. Examples of thermosetting engineering plastics may include phenol, urea, melamine, alkyd, unsaturated polyester, epoxy, diarylphthalate, silicone, polyurethane, and the like.

PEEK in the thermoplastic engineering plastics is prepared by the solution condensation reaction of halogenated benzophenone and hydrokinone, and has excellent features such as heat resistance, toughness, flame resistance, and chemical resistance. Furthermore, PEEK has grades containing 10, 20, and 30% glass fiber for high strength, high rigidity, and high dimensional accuracy. The heat deflection temperature of GF 20% reinforced products is about 300° C., and the long term heat resistance at UL temperature index is 240° C. In addition, PEEK may be molded by a general molding machine or an extrusion molding machine with good heat resistance and may have good resistance to gamma irradiation.

The first and second bodies 100 and 200 may be coupled to each other by applying an adhesive on a lower surface of the first body 100 where the flow paths are not formed and on an upper surface of the second body 200 where the flow paths are not formed. That is, the coupling of the first body 100 and the second body 200 may be performed by the adhesive.

Furthermore, the coupling of the first body 100 and the second body 200 may be performed by ultrasonic welding. The detailed description thereof will be described herein.

The First Upper Flow Path Part 130

Hereinbelow, the first upper flow path part 130 will be described with reference to FIGS. 2 to 7.

The first upper flow path part 130 is provided at the left side of the lower surface of the first body 100. The first upper flow path part 130 may include: a first main flow path 131 communicating perpendicularly with the first vertical flow path 111 that communicates with the first main hole 110; and a first branched section 133 communicating with the first main flow path 131 and configured such that lower portions of ends thereof communicate with upper portions of first sides of the first to eighth lower flow paths 212 to 218 of the lower flow path part.

The first branched section 133 includes: the first main branched flow path 132 communicating with the first main flow path 131; a 1-1th branched flow path 133a communicating with a first end of the first main branched flow path 132 (front end of first main branched flow path 132 in FIG. 3); a 1-2nd branched flow path 133b communicating with a first end of the 1-1th branched flow path 133a (front end of 1-1th branched flow path 133a in FIG. 3); a 1-3rd branched flow path 133c communicating with a second end of the 1-1th branched flow path 133a (rear end of 1-1th branched flow path 133a in FIG. 3); a 1-4th branched flow path 133d communicating with a second end of the first main branched flow path 132 (rear end of first main branched flow path 132 in FIG. 3); a 1-5th branched flow path 133e communicating with a first end of the 1-4th branched flow path 133d (front end of 1-4th branched flow path 133d in FIG. 3); and a 1-6th branched flow path 133f communicating with a second end of the 1-4th branched flow path 133d (rear end of 1-4th branched flow path 133d in FIG. 3).

The first main branched flow path 132 have a '-' shape, and functions to branch the cleaning liquid flowing from the first main flow path 131 to opposite sides in the 180 degrees direction.

The 1-1th to 1-6th branched flow paths 133a to 133f each has a '⊥' shape, and functions to branch the cleaning liquid flowing from a flow path communicating in front thereof to opposite sides in the 180 degrees direction.

A lower portion of a first end of the 1-2nd branched flow path 133b (front end of 1-2nd branched flow path 133b in FIGS. 3 and 7) communicates with an upper portion of a first side (left side in FIGS. 4 and 7) of a first lower flow path 211 of the lower flow path part.

A lower portion of a second end of the 1-2nd branched flow path 133b (rear end of 1-2nd branched flow path 133b in FIGS. 3 and 7) communicates with an upper portion of a first side (left side in FIGS. 4 and 7) of a second lower flow path 212 of the lower flow path part.

A lower portion of a first end of the 1-3rd branched flow path 133c (front end of 1-3rd branched flow path 133c in FIGS. 3 and 7) communicates with an upper portion of a first side (left side in FIGS. 4 and 7) of a third lower flow path 213 of the lower flow path part.

A lower portion of a second end of the 1-3rd branched flow path 133c (rear end of 1-3rd branched flow path 133c in FIGS. 3 and 7) communicates with an upper portion of a first side (left side in FIGS. 4 and 7) of a fourth lower flow path 214 of the lower flow path part.

A lower portion of a first end of the 1-5th branched flow path 133e (front end of 1-5th branched flow path 133e in FIGS. 3 and 7) communicates with an upper portion of a first side (left side in FIGS. 4 and 7) of a fifth lower flow path 215 of the lower flow path part.

A lower portion of a second end of the 1-5th branched flow path 133e (rear end of 1-5th branched flow path 133e in FIGS. 3 and 7) communicates with an upper portion of a first side (left side in FIGS. 4 and 7) of a sixth lower flow path 216 of the lower flow path part.

A lower portion of a first end of the 1-6th branched flow path 133f (front end of 1-6th branched flow path 133f in FIGS. 3 and 7) communicates with an upper portion of a first side (left side in FIGS. 4 and 7) of a seventh lower flow path 217 of the lower flow path part.

A lower portion of a second end of the 1-6th branched flow path 133f (rear end of the 1-6th branched flow path 133f in FIGS. 3 and 7) communicates with an upper portion of a first side (left side in FIGS. 4 and 7) of a the eighth lower flow path 218 of the lower flow path part.

The ends of each of the 1-2nd branched flow path 133b, the 1-3rd branched flow path 133c, the 1-5th branched flow path 133e, and the 1-6th branched flow path 133f are provided to be blocked by the first body 100.

The cleaning liquid flows into the ends, that is, the first end and the second end, of each of the 1-2nd branched flow path 133b, the 1-3rd branched flow path 133c, the 1-5th branched flow path 133e, and the 1-6th branched flow path 133f. When the cleaning liquid flows into one of the ends, the cleaning liquid flows only into an upper portion of a first side of one of the first to eighth lower flow paths 212 to 218, the upper portion of the first side communicating with a lower portion of the end into which the cleaning liquid flows.

The Second Upper Flow Path Part 140

Hereinbelow, the second upper flow path part 140 will be described with reference to FIGS. 2 to 7.

The second upper flow path part 140 is provided at the right side of the lower surface of the first body 100. The second upper flow path part 140 may include: a second main flow path 141 communicating perpendicularly with the second vertical flow path 121 that communicates with the second main hole 120; and a second branched section 143 communicating with the second main flow path 141 and configured such that lower portions of ends thereof communicate with upper portions of second sides of the first to eighth lower flow paths 212 to 218 of the lower flow path part.

The second branched section 143 includes: the second main branched flow path 142 communicating with the second main flow path 141; a 2-1st branched flow path 143a communicating with a first end of the second main branched flow path 142 (front end of second main branched flow path 142 in FIG. 3); a 2-2nd branched flow path 143b communicating with a first end of the 2-1st branched flow path 143a (front end of 2-1st branched flow path 143a in FIG. 3); a 2-3rd branched flow path 143c communicating with a second end of the 2-1st branched flow path 143a (rear end of 2-1st branched flow path 143a in FIG. 3); a 2-4th branched flow path 143d communicating with a second end of the second main branched flow path 142 (rear end of second main branched flow path 142 in FIG. 3); a 2-5th branched flow path 143e communicating with a first end of the 2-4th branched flow path 143d (front end of 2-4th branched flow path 143d in FIG. 3); and a 2-6th branched flow path 143f communicating with a second end of the 2-4th branched flow path 143d (rear end of 2-4th branched flow path 143d in FIG. 3).

The second main branched flow path 142 have the '-' shape, and functions to branch cleaning liquid flowing from the second main flow path 141 to opposite sides in the 180 degrees direction.

The 2-1st to the 2-6th branched flow paths 143a to 143f each have the '⊥' shape, and functions to branch the cleaning liquid flowing from a flow path communicating in front thereof to opposite sides in the 180 degrees direction.

A lower portion of a first side of the 2-2nd branched flow path 143b (front end of 2-2nd branched flow path 143b in FIGS. 3 and 7) communicates with an upper portion of a second side (right side in FIGS. 4 and 7) of the second lower flow path 212 of the lower flow path part.

A lower portion of a second end of the 2-2nd branched flow path 143b (rear end of 2-2nd branched flow path 143b in FIGS. 3 and 7) communicates with an upper portion of a second side (right side in FIGS. 4 and 7) of the second lower flow path 212 of the lower flow path part.

A lower portion of a first side of the 2-3rd branched flow path 143c (front end of 2-3rd branched flow path 143c in FIGS. 3 and 7) communicates with an upper portion of a second side (right side in FIGS. 4 and 7) of the third lower flow path 213 of the lower flow path part.

A lower portion of a second side of the 2-3rd branched flow path 143c (rear end of 2-3rd branched flow path 143c in FIGS. 3 and 7) communicates with an upper portion of a second side (right side in FIGS. 4 and 7) of the fourth lower flow path 214 of the lower flow path part.

A lower portion of a first side of the 2-5th branched flow path 143e (front end of 2-5th branched flow path 143e in FIGS. 3 and 7) communicates with an upper portion of a second side (right side in FIGS. 4 and 7) of the fifth lower flow path 215 of the lower flow path part.

A lower portion of a second end of the 2-5th branched flow path 143e (rear end of 2-5th branched flow path 143e in FIGS. 3 and 7) communicates with an upper portion of a second side (right side in FIGS. 4 and 7) of the sixth lower flow path 216 of the lower flow path part.

A lower portion of a first end of the 2-6th branched flow path 143f (front end of 2-6th branched flow path 143f in FIGS. 3 and 7) communicates with an upper portion of a second side (right side in FIGS. 4 and 7) of the seventh lower flow path 217 of the lower flow path part.

A lower portion of a second end of the 2-6th branched flow path 143f (rear end of 2-6th branched flow path 143f in FIGS. 3 and 7) communicates with an upper portion of a second side (right side in FIGS. 4 and 7) of the eighth lower flow path 218 of the lower flow path part.

The ends of each of the 2-2nd branched flow path 143b, the 2-3rd branched flow path 143c, the 2-5th branched flow path 143e, and the 2-6th branched flow path 143f are provided to be blocked by the first body 100.

The cleaning liquid flows into the ends, that is, the first end and the second end, of each of the 2-2nd branched flow path 143b, the 2-3rd branched flow path 143c, the 2-5th branched flow path 143e, and the 2-6th branched flow path 143f. When the cleaning liquid flows into one of the ends, the cleaning liquid flows only into an upper portion of a second side of one of the first to eighth lower flow paths 212 to 218, the upper portion of the second side communicating with a lower portion of the end into which the cleaning liquid flows.

The upper surface of the upper flow path part, that is, an upper surface of the first upper flow path part 130 and an upper surface of the second upper flow path part 140 are provided on the same plane, that is, on a first plane. The first plane means an X-Y plane that is spaced upwards from the lower surface of the first body 100 by a depth of the first and second upper flow path parts 130 and 140 in the Z axis direction. At this point, the first and second upper flow path parts 130 and 140 are assumed to be machined from the lower surface of the first body 100 in the Z axis direction, that is, in an upward direction so that the lower portions thereof are open.

The lower surface of the lower flow path part, that is, a lower surface of each of the first to eighth lower flow paths 212 to 218 is provided on the same plane, that is, a second plane. The second plane means an X-Y plane that is spaced downwards from the upper surface of the second body 200 in the Z axis direction by a depth of each of the first to eighth lower flow paths 212 to 218. At this point, the first to eighth lower flow paths 212 to 218 are assumed to be machined from the upper surface of the second body 200 in the Z axis direction, that is, a downward direction so that the upper portions are open.

When the first body 100 and the second body 200 are coupled together thus the upper flow path part and the lower flow path part communicate with each other (that is, the first upper flow path part 130 and the upper portion of the left side of the lower flow path part communicate with each other, and the second upper flow path part 140 and the upper portion of the right side of the lower flow path part communicate with each other), the first plane on which the upper flow path part is provided and the second plane on which the lower flow path part is provided are spaced apart from each other in a upward to downward direction, that is, the Z axis direction. Accordingly, a communicating section between the upper flow path part and the lower flow path part, that is, between the first and second upper flow path parts 130 and 140 and the first to eighth lower flow paths 212 to 218, has a vertical head (difference in elevation). The head reduces the supply pressure of the cleaning liquid supplied to the nozzle 10 for cleaning a substrate, thereby ensuring a uniform discharging pressure of the cleaning liquid, which will be described herein.

The first upper flow path part 130 and the second upper flow path part 140 are provided on the lower surface of the first body 100, the upper surface of the first upper flow path part 130 and the upper surface of the second upper flow path part 140 are provided to be positioned on the first plane, and the first upper flow path part 130 and the second upper flow path part 140 have the same depth. However, the first upper flow path part 130 and the second upper flow path part 140 are not in communication with each other, but communicate with each other only through the lower flow path part, that is, the first to eighth lower flow paths 212 to 218. In other words, on the first body 100, the first upper flow path part 130 and the second upper flow path part 140 are not in communication with each other.

As the first upper flow path part 130 and the second upper flow path part 140 are not in communication with each other on the first body 100, flows of the cleaning liquid in the first upper flow path part 130 and the second upper flow path part 140 are independent from each other and do not affect each other.

When the cleaning liquid is supplied through the first main hole 110 and the second main hole 120, a cleaning liquid supplied to the first upper flow path part 130 flows each of the first and second upper flow path parts 130 and 140 independently from a cleaning liquid supplied to the second upper flow path part 140. Accordingly, the supply pressures of the cleaning liquids the first upper flow path part 130 and the second upper flow path part 140 do not affect each other so that the first and second upper flow path parts 130 and 140 may maintain uniform flow pressures of the cleaning liquids thereof.

As described above, the nozzle 10 for cleaning a substrate is configured such that, as the first and second bodies 100 and 200 are coupled together, lower surfaces of the first and second flow path parts are provided by the upper surface of the second body 200, and upper surfaces of the first to eighth lower flow paths 212 to 218 are provided by the lower surface of the first body 100.

The nozzle 10 for cleaning a substrate having the above-described configuration may have another modified embodiment.

A Nozzle 10' for Cleaning a Substrate According to the Modified Embodiment of the Present Invention Hereinbelow, the nozzle 10' for cleaning a substrate according to the modified embodiment of the present invention will be described with reference to FIGS. 8 to 10.

Figure 8:
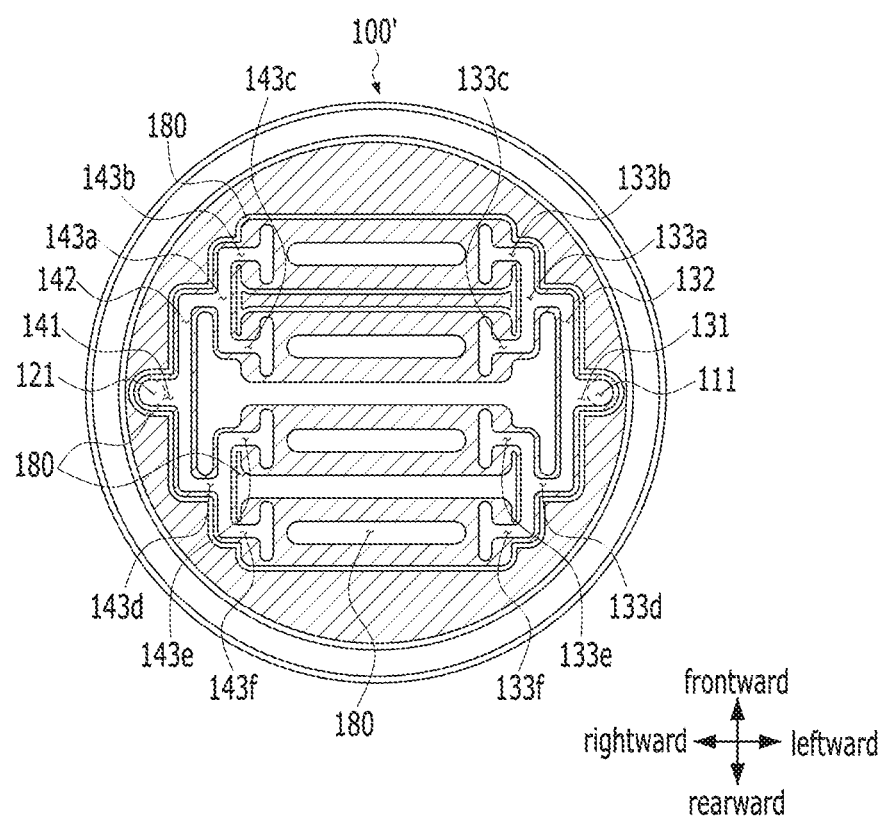
FIG. 8 is a bottom view showing a lower surface of a first body of a nozzle for cleaning a substrate according to a modified embodiment of the present invention.

FIG. 8 is a bottom view showing a lower surface of a first body of the nozzle for cleaning a substrate according to the modified embodiment of the present invention; FIG. 9 is a plane view showing an upper surface of a second body of the nozzle for cleaning a substrate according to the modified embodiment of the present invention; and FIG. 10 is a perspective plane view showing a flow path structure inside the first and second bodies of FIGS. 8 and 9, the first and second bodies being coupled together.

In the nozzle 10 for cleaning a substrate', a welding groove 180 is provided on a lower surface of a first body 100', and a welding protrusion 280 inserted into the welding groove 180 is provided on an upper surface of a second body 200'. That is, the welding groove 180 is provided on the lower surface of the first body 100 of the above-described nozzle 10 for cleaning a substrate, and the welding protrusion 280 is provided on the upper surface of the second body 200 thereof.

As shown in FIG. 8, the welding groove 180 is provided on the lower surface of the first body 100', and functions to provide a space into which the welding protrusion 280 is inserted.

The welding groove 180 is provided as a plurality of welding grooves. At least some of the plurality of welding grooves 180 are formed outside the first and second upper flow path parts 130 and 140 to surround the first and second upper flow path parts 130 and 140.

Some of the plurality of welding grooves 180, that is, the remaining welding grooves 180 are formed inside the first and second upper flow path parts 130 and 140.

At this point, the welding grooves 180 are formed on an area of the first body 100' where the first and second upper flow path parts 130 and 140 are not formed and an area thereof corresponding to an area of the second body 200' where the lower flow path part, that is, the first to eighth lower flow paths 212 to 218 (or lower flow paths) are not formed.

Figure 10:
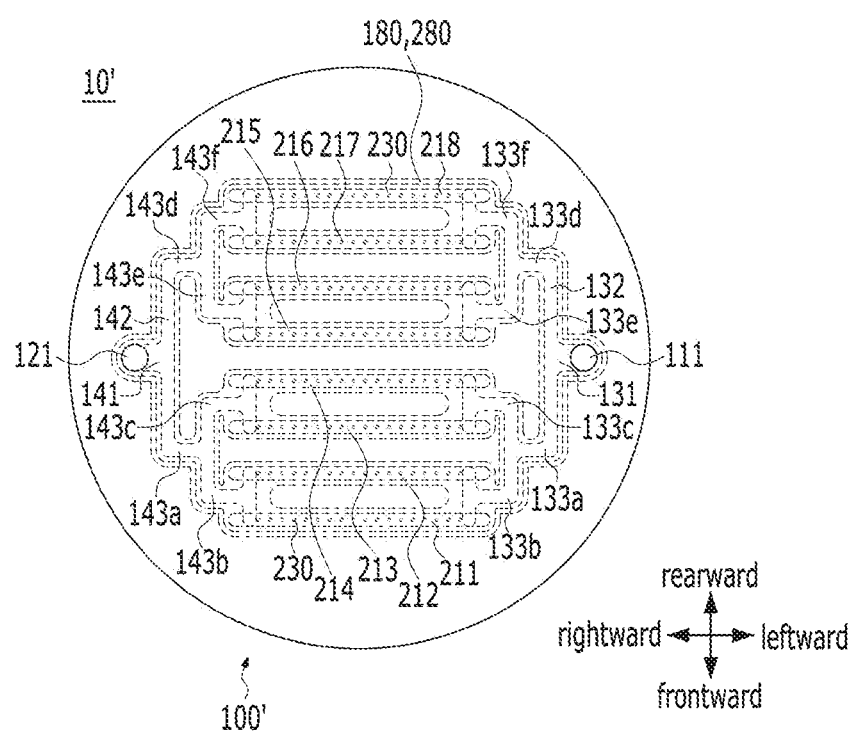
FIG. 10 is a perspective plane view showing a flow path structure inside the first and second bodies of FIGS. 8 and 9, the first and second bodies being coupled together.

As shown in FIG. 10, the welding grooves 180 that are formed outside the first and second upper flow path parts 130 and 140 are formed on the lower surface of the first body 100' to surround the first and second upper flow path parts 130 and 140 and the first to eighth lower flow paths 212 to 218 when the first and second bodies 100' and 200' are coupled together.

Furthermore, the welding grooves 180 formed inside the first and second upper flow path parts 130 and 140 are formed on the lower surface of the first body 100' to be positioned between the flow paths when the first and second bodies 100' and 200' are coupled together.

As shown in FIG. 10, the welding grooves 180 formed inside the first and second upper flow path parts 130 and 140 may be formed on the lower surface of the first body 100' to be positioned (1) between ends of 1-2nd and 2-2nd branched flow paths 133b and 143b and first and second lower flow paths 211 and 212; (2) between ends of 1-3rd and 2-3rd branched flow paths 133c and 143c and third and fourth lower flow paths 213 and 214; (3) between ends of 1-5th and 2-5th branched flow paths 133e and 143e and fifth and sixth lower flow paths 215 and 216; (4) between ends of 1-6th and 2-6th branched flow paths 133f and 143f and seventh and eighth lower flow paths 217 and 218; (5) between ends of 1-1th and 2-1th branched flow paths 133a and 143a and second and third lower flow paths 212 and 213; (6) between ends of 1-4th and 2-4th branched flow paths 133d and 143d and sixth and seventh lower flow paths 216 and 217; and (7) between first and second main branched flow paths 132 and 142 and fourth and fifth lower flow paths 214 and 215.

Figure 9:
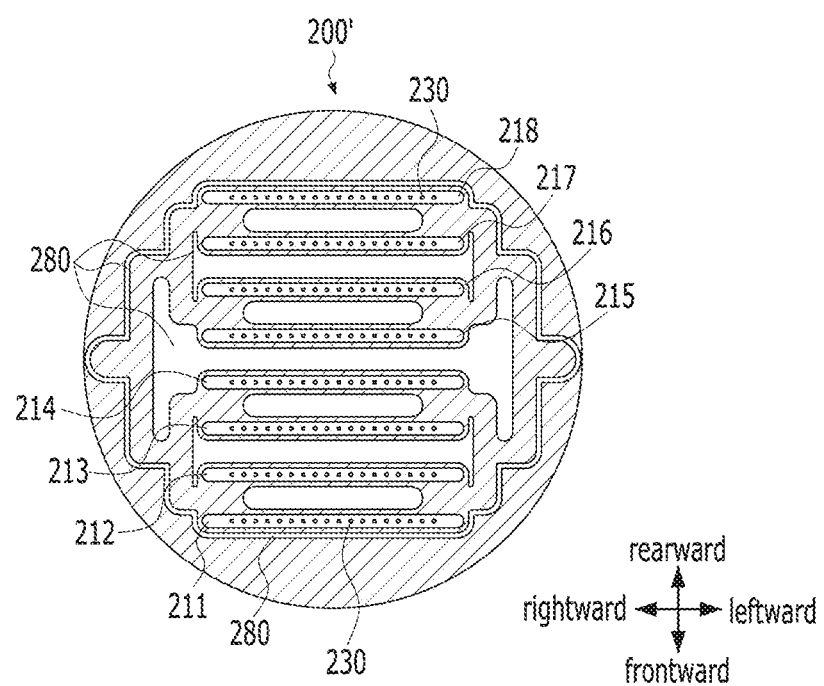
FIG. 9 is a plane view showing an upper surface of a second body of the nozzle for cleaning a substrate according to the modified embodiment of the present invention.

As shown in FIG. 9, the welding protrusion 280 is formed on the upper surface of the second body 200', and functions to be inserted into each of the welding grooves 180 when the first and second bodies 100' and 200' are coupled together.

The welding protrusion 280 is provided as a plurality of welding protrusions 280 to have shapes corresponding to the welding grooves 180. At least some of the plurality of welding protrusions 280 are formed outside the first to eighth lower flow paths 212 to 218 to surround the lower flow path part, that is, the first to eighth lower flow paths 212 to 218 (or plurality of lower flow paths).

Some of the plurality of welding protrusions 280, that is, the remaining welding protrusions 280, are formed inside the first to eighth lower flow paths 212 to 218, that is, between the first to eighth lower flow paths 212 to 218.

At this point, the welding protrusions 280 are formed on an area of the second body 200' where the lower flow path part, that is, the first to eighth lower flow paths 212 to 218

(or plurality of lower flow paths) are not formed and an area thereof corresponding to an area of the first body 100' where the first and second upper flow path parts 130 and 140 are not formed.

As shown in FIG. 10, the welding protrusions 280 that are formed outside the first to eighth lower flow paths 212 to 218 are formed on the upper surface of the second body 200' to surround the first and second upper flow path parts 130 and 140 and the first to eighth lower flow paths 212 to 218 when the first and second bodies 100' and 200' are coupled together.

Furthermore, the welding protrusions 280 formed inside the first to eighth lower flow paths 212 to 218 are formed on the upper surface of the second body 200' to be positioned between the flow paths when the first and second bodies 100' and 200' are coupled together.

As shown in FIG. 10, the welding protrusions 280 formed inside the first to eighth lower flow paths 212 to 218 may be formed on the upper surface of the second body 200' to be positioned (1) between the ends of the 1-2nd and 2-2nd branched flow paths 133*b* and 143*b* and the first and second lower flow paths 211 and 212; (2) between the ends of the 1-3rd and 2-3rd branched flow paths 133*c* and 143*c* and the third and fourth lower flow paths 213 and 214; (3) between the ends of the 1-5th and 2-5th branched flow paths 133*e* and 143*e* and the fifth and sixth lower flow paths 215 and 216; (4) between the ends of the 1-6th and 2-6th branched flow paths 133*f* and 143*f* and the seventh and eighth lower flow paths 217 and 218; (5) between the ends of the 1-1th and 2-1th branched flow paths 133*a* and 143*a* and the second and third lower flow paths 212 and 213; (6) between the ends of the 1-4th and 2-4th branched flow paths 133*d* and 143*d* and the sixth and seventh lower flow paths 216 and 217; and (7) between the ends of the first and second main branched flow paths 132 and 142 and the fourth and fifth lower flow paths 214 and 215. In other words, the welding protrusions 280 have the shapes corresponding to the welding grooves 180 to be inserted into the welding grooves 180 when the first and second bodies 100' and 200' are coupled together.

The depth of the above-described welding groove 180 is formed deeper than the depth of the first and second upper flow path parts 130 and 140 and the depth of the lower flow path part, that is, the first to eighth lower flow paths 212 to 218. Thus, when the depth of the welding groove 180 is deeper than the depths of the above-described flow paths, during ultrasonic welding, the welding protrusion 280 or a welding thread inserted into the welding groove 180 is welded first before the flow paths are welded, thereby preventing damages of the flow paths.

Furthermore, welding threads (not shown) may be formed in any one of the welding grooves 180 and the welding protrusions 280.

When the welding threads are formed in the welding grooves 180, the welding threads may be formed by protruding on surfaces of the welding grooves 180, the surfaces being in contact with the welding protrusions 280, along the welding groove 180.

When the welding threads are formed in the welding protrusion 280, the welding threads may be formed by protruding on surfaces of the welding protrusions 280, the surfaces being in contact with the welding grooves 180, along the welding protrusion 280.

The welding threads are welded by contacting between contact surfaces of the welding grooves 180 and the welding protrusions 280 during ultrasonic welding, which will be described herein.

The welding protrusions 280 may be formed on the lower surface of the first body 100', unlike the above description. Thus, the welding grooves 180 may be formed on the upper surface of the second body 200'. That is, the welding grooves 180 may be formed on any one of the first and second bodies 100' and 200', and the welding protrusion 280 may be formed on the remaining of the first and second bodies 100' and 200'.

As described above, the welding grooves 180 and the welding protrusions 280 of the nozzle 10 for cleaning a substrate' according to the modified embodiment of the present invention function to achieve easy coupling of the first and second bodies 100' and 200', the detailed description thereof will be described in a method of manufacturing a nozzle described herein.

A Method of Manufacturing the Nozzle 10 and 10' for Cleaning a Substrate Hereinbelow, according to an exemplary embodiment of the present invention, the method of manufacturing the nozzle 10 for cleaning a substrate will be described, the nozzle having the above-described configuration.

According to the exemplary embodiment of the present invention, the method of manufacturing the nozzle 10 for cleaning a substrate may include: providing the bodies, wherein the first body 100 is provided such that the first upper flow path part 130 and the second upper flow path part 140 are formed on the lower surface thereof and the first main hole 110 communicating with the first upper flow path part 130 and the second main hole 120 communicating with the second upper flow path part 140 are formed on the lower are formed on the upper surface thereof, and the second body 200 is provided such that the plurality of lower flow paths (or first to eighth lower flow paths 212 to 218 in the present invention) is formed separately on the upper surface thereof to be spaced apart from each other; and coupling the lower surface of the first body 100 and the upper surface of the second body 200 together, wherein the coupling is provided to connect the upper portion of the first side of each of the plurality of lower flow paths to the lower portion of the end of the first branched section 133 of the first upper flow path part 130 so as to allow the first side of each of the lower flow paths and the end of the first branched section to communicate with each other, and to connect the upper portion of the second side of each of the plurality of lower flow paths to the lower portion of the end of the second branched section 143 of the second upper flow path part 140 so as to allow the second side of each of the lower flow paths and the end of the second branched section 143 to communicate with each other.

Furthermore, in the providing the bodies, the center hole 101 may be formed at the center of the first body 100 between the first and second main holes 110 and 120. The first upper flow path part 130, the second upper flow path part 140, the first main hole 110, the second main hole 120, and the center hole 101, which are formed in the providing the bodies, may be formed on the first body 100 by machining.

In the providing the bodies, the first main hole 110 communicates with the first upper flow path part 130 through the first vertical flow path 111. The second main hole 120 communicates with the second upper flow path part 140 through the second vertical flow path 121.

In the providing the bodies, the first upper flow path part 130 may include the first main flow path 131, the first main branched flow path 132, and the first branched section 133. The second upper flow path part 140 may include the second main flow path 141, the second main branched flow path 142, and the second branched section 143. Descriptions thereof may be replaced with the above descriptions.

In the providing the bodies, the plurality of lower flow paths is formed on the second body 200 by machining. The plurality of lower flow paths constitutes the lower flow path part, and may be provided as the first to eighth lower flow paths 212 to 218. A description thereof may be replaced with the above description.

In the coupling, the first and second upper flow path parts 130 and 140 and the plurality of lower flow paths are respectively formed by machining. Unmachined portions the first and second bodies 100 and 200 and machined portions of the first and second bodies 100 and 200 face each other to form a sealed flow path structure. At this point, an unmachined portion of the first body 100 means a portion of the lower surface of the first body 100 where the first and second upper flow path parts 130 and 140 are not formed, and an unmachined portion of the second body 200 means a portion of the upper surface of the second body 200 where the plurality of lower flow paths is not formed.

In the providing the bodies, the lower surfaces of the first and second upper flow path parts 130 and 140 become the unmachined portion of the second body 200 to form the sealed flow path structure. In addition, the upper surfaces of the plurality of lower flow paths become the unmachined portion of the first body 100 to form the sealed flow path structure. However, communication sections in which the first and second upper flow path parts 130 and 140 and the plurality of lower flow paths communicate with each other (that is, end sections of the first and second branched sections 133 and 143) forms a flow path structure by the machined portions of the first and second bodies 100 and 200.

In the coupling, the coupling between the lower surface of the first body 100 and the upper surface of the second body 200 may be the coupling between the unmachined portions of the first and second bodies 100 and 200, that is, between the portion of the lower surface of the first body 100 where the first and second upper flow paths are not formed and the portion of the second body 200 where the plurality of lower flow paths is not formed.

The above-described method of manufacturing the nozzle 10 for cleaning a substrate has the following effects.

The flow path structure is provided in each of the first and second bodies 100 and 200, and then the first and second bodies 100 and 200 are coupled together, so that formation of the flow path structure may be easily realized As described above, the first and second upper flow path parts 130 and 140, and the plurality of lower flow paths are respectively formed by machining, and the unmachined portions of the first and second bodies 100 and 200 and the machined portions of the first and second bodies 100 and 200 face each other to form the flow path structure. Accordingly, the rate of machining a flow path may be reduced, thereby contributing the high pressure resistance performance of the nozzle 10 for cleaning a substrate.

In the nozzle 10' for cleaning a substrate having the welding grooves 180 and the welding protrusions 280 according to the modified embodiment of the present invention, the following manufacturing method may be used.

As shown in FIGS. 8 to 10, in the providing bodies, the welding protrusions 280 are formed on any one of the lower surface of the first body 100' and the upper surface of the second body 200', the welding grooves 180 into which the welding protrusions 280 are inserted are formed on the remaining of the lower surface of the first body 100' and the upper surface of the second body 200'. At least some of the welding protrusions 280 and at least some of the welding grooves 180 are formed outside the first and second upper flow path parts 130 and 140 and the plurality of lower flow paths to surround the first and second upper flow path parts 130 and 140 and the plurality of lower flow paths (lower flow path part or first to eighth lower flow path 211 to 218).

Furthermore, in the providing the bodies, the first body 100' and the second body 200' are made of a resin material. In the coupling, the coupling of the lower surface of the first body 100' and the upper surface of the second body 200' together is performed by welding the welding protrusions 280 and the welding grooves 180 by using ultrasonic welding. Preferably, the resin material forming the first body 100' and the second body 200' may be PEEK.

Ultrasonic welding means that two or more plastic contact surfaces are in close contact with each other and welded due to heat generation, softening, and melting caused by ultrasonic vibration of plastic itself. Ultrasonic welding may be classified into methods such as welding, spot welding, inserting, swaging, slitting, and the like. An ultrasonic welding machine for performing ultrasonic welding is operated as follow. The power of 100-250V and 50-60 Hz is converted into electric energy of 20 KHz and 35 KHz by a generator, and the electric energy is converted into mechanical vibration energy by a converter. When the ultrasonic vibration energy formed by controlling the amplitude thereof by the converter is transferred to a welding object by a horn, instantaneous frictional heat is generated at contact surfaces of the welding object, thereby performing strong molecular coupling.

Ultrasonic welding performed in the coupling is performed such that, after electric energy is converted into mechanical vibration energy through a vibrator in the horn, when ultrasonic wave is emitted from the horn while the first body 100' and the second body 200' are stacked and at least any one of the first body 100' and the second body 200' is pressurized, instantaneous frictional heat is generated at coupling surfaces, that is, the contact surfaces, of the first body 100' and the second body 200'.

As described above, as the welding protrusions 280 inserted into the welding grooves 180 are welded by the horn, the welding protrusions 280 and the welding grooves 180 are welded to each other. Accordingly, the first and second bodies 100' and 200' may be coupled to each other. In other words, insertion surfaces of the welding protrusions 280 inserted into the welding grooves 180 may be the coupling surfaces or the contact surfaces.

Ultrasonic welding performed in the coupling may be performed by emitting ultrasonic wave through the lower surface of the second body 200', the ultrasonic wave is generated from the horn. In this case, for precise welding, the ultrasonic wave can be emitted only at the welding grooves 180 and the welding protrusions 280.

As described above, in the coupling, as ultrasonic welding is used in the coupling of the first and second bodies 100' and 200' together, the coupling can be easily performed.

Furthermore, as some of the welding protrusions 280 and some of the welding grooves 180 are formed to surround the flow paths, and the remaining of the welding protrusions 280 and the remaining of the welding grooves 180 are formed to positioned between the flow paths, the coupling of the flow paths may be solidly maintained by welding the welding protrusions 280 to the welding grooves 180. Accordingly, the cleaning liquid can be prevented from flowing out of the flow paths.

Furthermore, as the depth of each of the welding grooves 180 is formed deeper than the depth of each of the flow paths, the flow paths can be prevented from being damaged during ultrasonic welding.

There is no need for a separate adhesive for the coupling, and a coupling state may be solidly maintained due to the strong molecular coupling. Due to the strong coupling force, the flow paths can be prevented from being damaged, so that the high pressure resistance performance of the nozzle 10' for cleaning a substrate can be maintained.

Ultrasonic welding is performed from 0.1 seconds to 1 second, so the process time thereof is very short, thus ultrasonic welding is advantageous for mass production, and can perform clean coupling machining without deformation and deterioration of a product surface.

Since a semiconductor with less etching compared to a glass material such as quartz, that is, a resin material, is used, the coupling is semi-permanent. In addition, when the first and second bodies 100' and 200' are coupled together, the power consumption is low, thereby reducing the defective rate of the product, and reducing the flow path manufacturing cost.

In the providing the bodies, as described above, the welding grooves 180 and the welding protrusions 280 may have the welding threads. The welding treads are welded by the ultrasonic wave generated from ultrasonic welding machine during the coupling, so that the coupling due to the welding of the welding grooves 180 to the welding protrusions 280 may be performed.

In detail, during ultrasonic welding, melting liquid of the welding protrusions 280 is insufficiently filled in lower surfaces of the welding protrusions 280, thereby causing a void, that is, a pore occurring in a specific portion. The welding threads formed to correspond to the portion where the pore mainly occurs can prevent the void.

In the case in that the welding threads are formed on the welding grooves 180 or the welding protrusions 280, when the welding protrusions 280 are formed in the providing the bodies, the height of each of the welding protrusions 280 may be formed lower than existing welding protrusions in consideration of the amount of melting the welding threads (or depth of welding groove 180 may be formed deeper than existing welding groove).

The nozzle 10 and 10' for cleaning a substrate manufactured by the above-described manufactured methods is configured such that the first body 100 and 100' and the second body 200 and 200' are formed separately and coupled together. Accordingly, the flow paths of various shapes can be easily formed.

Furthermore, the first body 100' and the second body 200' are made of the resin material, and are coupled together by using ultrasonic welding. Accordingly, the nozzle 10' for cleaning a substrate can have the high pressure resistance performance, thus the nozzle 10' can be supplied with the cleaning liquid within various pressure ranges to clean the substrate.

Flow of Cleaning Liquid in the Nozzle 10 for Cleaning a Substrate

Hereinbelow, the flow of cleaning liquid in the above-described nozzle 10 for cleaning a substrate will be described with reference to FIGS. 6 and 7.

When cleaning liquid is supplied through the first main hole 110, the cleaning liquid flows into the first vertical flow path 111.

The cleaning liquid flowing into the first vertical flow path 111 passes through the first main flow path 131 to flow into the first main branched flow path 132. In this case, since the first vertical flow path 111 and the first main flow path 131 communicate perpendicularly with each other, the cleaning liquid flowing through the first vertical flow path 111 hits the upper surface of the second body 200, and then flows into the first main flow path 131 및 the first main branched flow path 132.

The cleaning liquid flowing into the first main branched flow path 132 passes through the first branched section 133. Then the cleaning liquid is discharged to the outside through the discharging hole 230 formed on the bottom surface of each of the first to eighth lower flow paths 211 to 218, the flow thereof will be described as follow.

The cleaning liquid flowing into the first end of the first main branched flow path 132 passes through the 1-1th branched flow path 133a and then the 1-2nd branched flow path 133b to flow into first sides (left side in FIG. 7) of the first lower flow path 211 and the second lower flow path 212, or passes through the 1-1th branched flow path 133a and then the 1-3rd branched flow path 133c to flow into first sides (left side in FIG. 7) of the third lower flow path 213 and the fourth lower flow path 214.

The cleaning liquid flowing into the first sides (left side in FIG. 7) of the first to fourth lower flow paths 211 to 214 is discharged out of the nozzle 10 for cleaning a substrate through a plurality of discharging holes 230 formed on a bottom surface of each of the first and fourth lower flow paths 211 to 214.

The cleaning liquid flowing into the second end of the first main branched flow path 132 passes through the 1-4th branched flow path 133d and then the 1-5th branched flow path 133e to flow into first sides (left side in FIG. 7) of the fifth lower flow path 215 and the sixth lower flow path 216, or passes through the 1-4th branched flow path 133d and then the 1-6th branched flow path 133f to flow into first sides (left side in FIG. 7) of the seventh lower flow path 217 and the eighth lower flow path 218.

The cleaning liquid flowing into the first sides (left side in FIG. 7) of the fifth to eighth lower flow paths 215 to 218 is discharged out of the nozzle 10 for cleaning a substrate through the plurality of discharging holes 230 formed on a bottom surface of each of the fifth to eighth lower flow paths 215 to 218.

When cleaning liquid is supplied through the second main hole 120, the cleaning liquid flows into the second vertical flow path 121.

The cleaning liquid flowing into the second vertical flow path 121 passes through the second main flow path 141 to flow into the second main branched flow path 142. In this case, since the second vertical flow path 121 and the second main flow path 141 communicate perpendicularly with each other, the cleaning liquid flowing through the second vertical flow path 121 hits the upper surface of the second body 200, and then flows into the second main flow path 141 and the second main branched flow path 142.

The cleaning liquid flowing into the second main branched flow path 142 passes through the second branched section 143 and is discharged to the outside through the discharging hole 230 formed on the bottom surface of each of the first to eighth lower flow paths 211 to 218, and the flow thereof will be described as follow.

The cleaning liquid flowing into the first end of the second main branched flow path 142 passes through the 2-1st branched flow path 143a and then the 2-2nd branched flow path 143b to flow into second sides (right side of FIG. 7) of the first lower flow path 211 and the second lower flow path 212, or passes through the 2-1st branched flow path 143a and then the 2-3rd branched flow path 143c to flow into second sides (right side of FIG. 7) of the third lower flow path 213 and the fourth lower flow path 214.

The cleaning liquid flowing into the second sides (right side of FIG. 7) of the first to fourth lower flow paths 211 to 214 is discharged out of the nozzle 10 for cleaning a substrate through the plurality of discharging holes 230 formed on the bottom surface of each of the first to fourth lower flow paths 211 to 214.

The cleaning liquid flowing into the second end of the second main branched flow path 142 passes through the 2-4th branched flow path 143d and then the 2-5th branched flow path 143e to flow into second sides (right side of FIG. 7) of the fifth lower flow path 215 and the sixth lower flow path 216, or passes through the 1-4th branched flow path 133d and then the 1-6th branched flow path 133f to flow into second sides (right side in FIG. 7) of the seventh lower flow path 217 and the eighth lower flow path 218.

The cleaning liquid flowing into the second sides (right side in FIG. 7) of the fifth to eighth lower flow paths 215 to 218 is discharged out of the nozzle 10 for cleaning a substrate through the plurality of discharging holes 230 formed on the bottom surface of each of the fifth to eighth lower flow paths 215 to 218.

Due to the flow path structure and the flow of cleaning liquid, the nozzle 10 for cleaning a substrate according to the exemplary embodiments of the present invention has the following effects.

As described above, when the first and second bodies 100 and 200 are coupled together, the lower surfaces of the first and second upper flow path parts 130 and 140 are provided as the upper surface of the second body 200. Thus, the cleaning liquid supplied to the first vertical flow path 111 hits the upper surface of the second body 200 and then flows into the first main flow path 131. The cleaning liquid supplied to the second vertical flow path 121 hits the upper surface of the second body 200 and then flows into the second main flow path 141.

In the conventional nozzle, a surface where the supplied cleaning liquid hits is a surface where flow paths are machined. However, in the present invention, the surface where the cleaning liquid supplied through the first and second vertical flow paths 111 and 121 hits is the unmachined surface of the second body 200 (that is, surface where flow paths are not machined). Therefore, the strength of the unmachined surface is stronger than the machined surface, thus the pressure resistance performance is higher than the conventional nozzle.

In other words, the nozzle 10 for cleaning a substrate of the present invention has the higher pressure resistance performance than the conventional nozzle. Accordingly, even when the cleaning liquid is supplied to the nozzle 10 for cleaning a substrate with high supply pressure, the flow paths of the nozzle 10 for cleaning a substrate are prevented from being damaged, in comparison with the conventional nozzle. Therefore, the discharging pressure performance can be increased. In other words, due to the high pressure resistance performance of the nozzle 10 for cleaning a substrate, it is possible to discharge the cleaning liquid without the dead zone by providing the high discharging pressure by the high supply pressure, or by ensuring the uniformity of the cleaning liquid discharged through the discharging hole 230.

Furthermore, due to the high pressure resistance performance, it is possible to prevent the damage to the flow paths in the nozzle 10 for cleaning a substrate, and to prevent the damage to the coupling portion of the first and second bodies 100 and 200.

When the first body 100 and the second body 200 are coupled together to allow the upper flow path part and the lower flow path part communicate with each other (that is, first upper flow path part 130 and upper portions of left sides first to eighth lower flow paths 211 to 218 communicate with each other, and second upper flow path part 140 and upper portions of right sides of first to eighth lower flow paths 211 to 218 communicate with each other), the upper surface of the upper flow path part and the lower surface of the lower flow path part are spaced apart from each other in the vertical direction, that is, the Z axis direction (or, first plane and second plane are spaced apart from each other in the vertical direction, that is, the Z axis direction). Therefore, the communication section between each of the first and second upper flow path parts 130 and 140 and the lower flow path part, that is, the first to eighth lower flow paths 211 to 218 has the vertical head. In this case, the vertical head has a depth of each of the first to eighth lower flow paths 211 to 218.

Due to the vertical head, the cleaning liquid flowing in the X-Y plane flows in the Z axis direction in the communication section. This flow causes an effect of reducing the load due to the pressure of the cleaning liquid. Accordingly, the nozzle 10 for cleaning a substrate has the high pressure resistance performance through the vertical head.

As described above, the ends of each of the 1-2nd branched flow path 133b, the 1-3rd branched flow path 133c, the 1-5th branched flow path 133e, the 1-6th branched flow path 133f, the 2-2nd branched flow path 143b, the 2-3rd branched flow path 143c, the 2-5th branched flow path 143e, the 2-6th branched flow path 143f are formed to be blocked by the first body 100. Since the ends are blocked by the first body 100, a flow direction of the cleaning liquid can be naturally changed in a perpendicular direction so that the cleaning liquid can easily flow into the communication section.

The first to eighth lower flow paths 211 to 218 are formed separately to be spaced apart from each other, and arranged to be parallel with each other in the Y axis direction. Accordingly, forces applied to the flow paths facing each other can be canceled by flow pressure of the cleaning liquid flowing into the first to eighth lower flow paths 211 to 218.

In detail, the flow pressure of the cleaning liquid flowing into each of the first to eighth lower flow paths 211 to 218 apply a forces in forward and rearward directions of each of the first to eighth lower flow paths 211 to 218. In this case, the forces between the first lower flow path 211 and the second lower flow path 212; between the second lower flow path 212 and the third lower flow path 213; between the third lower flow path 213 and the fourth lower flow path 214; between the fourth lower flow path 214 and the fifth lower flow path 215; between the fifth lower flow path 215 and the sixth lower flow path 216; between the sixth lower flow path 216 and the seventh lower flow path 217; between the seventh lower flow path 217 and the eighth lower flow path 218; are canceled each other because the forces are opposite to each other. Therefore, unlike the conventional nozzle having the curved shape, the nozzle of the present invention is configured such that the first to eighth lower flow paths 211 to 218 can be efficiently prevented from being damaged. The effect by the first to eighth lower flow paths 211 to 218 also contributes to increasing the pressure resistance performance of the nozzle 10 for cleaning a substrate.

The high pressure resistance performance of the above-described nozzle 10 for cleaning a substrate can be provided even when the supply pressure of the cleaning liquid is from 4.5 Mpa to 6 MPa.

Due to the structure of The first upper flow path part 130 and the second upper flow path part 140, a flow distance of the cleaning liquid flowing into the first to eighth lower flow paths 211 to 218 through the first vertical flow path 111 and the first upper flow path part 130 and a flow distance of the cleaning liquid flowing into the first to eighth lower flow paths 211 to 218 through the second vertical flow path 121 and the second upper flow path part 140 are the same. Accordingly, since the same amount of the cleaning liquid is supplied to the opposite sides of the first to eighth lower flow paths 211 to 218, it is possible to ensure the uniform discharging of the cleaning liquid discharged through the discharging hole 230.

As described above, flow pressure of the cleaning liquid flowing into the discharging hole 230 through the first and second upper flow path parts 130 and 140 is maintained uniformly. Therefore, although the center hole 101 into which the piezoelectric element 300 is inserted is provided between the first and second main holes 110 and 120, the cleaning liquid can be discharged with the entirely uniform size through the discharging hole 230 positioned outside the piezoelectric element 300. Accordingly, the piezoelectric element 300 smaller than a piezoelectric element of the conventional nozzle can be inserted, thus miniaturization of the nozzle 10 for cleaning a substrate can be realized.

In the above description, the cleaning liquid is supplied to the first and second main holes 110 and 120, but the cleaning liquid may be supplied to only one of the first and second main holes 110 and 120.

Furthermore, when foreign matter such as particles in the cleaning liquid blocks the discharging hole 230 and the pressure inside the nozzle 10 for cleaning a substrate is increased abnormally sharply, the cleaning liquid may be discharged through at least any one of the first and second main holes 110 and 120 for lowering the pressure. In this case, the cleaning liquid discharged through the first and second upper flow path parts 130 and 140 causes upward pressure perpendicular to the first to eighth lower flow paths 211 to 218 of the lower flow path part, and the foreign matter blocking the discharging hole 230 can be removed by using the upward pressure.

In the present invention, the nozzle 10 for cleaning a substrate of has the eight lower flow paths, that is, the first to eighth lower flow paths 211 to 218. However, the number of the lower flow paths may vary on the basis of use of the nozzle 10 for cleaning a substrate and the size of the substrate to be cleaned. Correspondingly, the number of branches in the first and second branched sections 133 and 143 of the first and second upper flow path parts 130 and 140 may also vary.

Although the preferred embodiments of the present invention has been described for illustrative purposes, those skilled in the art will appreciate that various modifications, additions and substitutions are possible, without departing from the scope and spirit of the invention as disclosed in the accompanying claims.

The invention claimed is:

1. A nozzle for cleaning a substrate, the nozzle comprising:
    a first body;
    a second body coupled to a lower portion of the first body such that an upper surface of the second body is in contact with a lower surface of the first body;
    an upper flow path part provided in the first body and communicating with a main hole; and
    a lower flow path part provided in the second body and connecting the upper flow path part to a discharging hole so as to allow the upper flow path part and the discharging hole to communicate with each other,
    wherein an open upper portion of the lower flow path part is formed on the upper surface of the second body,
    wherein an upper surface of the upper flow path part and a lower surface of the lower flow path part are vertically spaced apart from each other,
    wherein the upper flow path part comprises:
        a main flow path communicating perpendicularly with a vertical flow path communicating with the main hole; and
        a branched section communicating with the main flow path and configured such that an open lower portion of the branched section communicates with the open upper portion of the lower flow path part, and
    wherein the open lower portion of the branched section is formed on the lower surface of the first body.

2. The nozzle for cleaning a substrate of claim 1,
    wherein an upper portion of the discharging hole communicates with the lower surface of the lower flow path part, and an open lower portion of the discharging hole is formed on a lower surface of the second body.

3. The nozzle for cleaning a substrate of claim 1, wherein an end of the branched section is blocked by the first body.

4. The nozzle for cleaning a substrate of claim 1, wherein the lower flow path part is provided as a plurality of lower flow paths that are formed separately and spaced apart from each other.

5. The nozzle for cleaning a substrate of claim 4, wherein each of the plurality of lower flow paths communicates with a plurality of discharging holes.

6. The nozzle for cleaning a substrate of claim 5, wherein the plurality of discharging holes communicating with each of the plurality of lower flow paths is arranged in one row in a longitudinal direction of each of the plurality of lower flow paths.

7. The nozzle for cleaning a substrate of claim 1, wherein the upper flow path part comprises a first upper flow path part communicating with a first side of the lower flow path part and a second upper flow path part communicating with a second side of the lower flow path part, the first upper flow path part and the second upper flow path part being configured to be in non-communication with each other on a same plane.

8. The nozzle for cleaning a substrate of claim 1, wherein the lower flow path part is provided as a plurality of lower flow paths, and
    flow distances of cleaning liquid flowing to the plurality of lower flow paths through the vertical flow path, the main flow path, and the branched section are the same.

* * * * *